United States Patent
Hasegawa

(10) Patent No.: US 11,018,181 B2
(45) Date of Patent: May 25, 2021

(54) SOLID-STATE IMAGING DEVICE

(71) Applicants: Kabushiki Kaisha Toshiba, Tokyo (JP); Toshiba Electronic Devices & Storage Corporation, Tokyo (JP)

(72) Inventor: Shunsuke Hasegawa, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 92 days.

(21) Appl. No.: 16/561,565

(22) Filed: Sep. 5, 2019

(65) Prior Publication Data
US 2020/0295080 A1 Sep. 17, 2020

(30) Foreign Application Priority Data
Mar. 15, 2019 (JP) .............................. JP2019-048072

(51) Int. Cl.
*H01L 21/00* (2006.01)
*H01L 27/148* (2006.01)

(52) U.S. Cl.
CPC .. *H01L 27/14868* (2013.01); *H01L 27/14818* (2013.01)

(58) Field of Classification Search
CPC ..................... H01L 27/14868; H01L 27/14818
See application file for complete search history.

(56) References Cited

U.S. PATENT DOCUMENTS

| | | | | |
|---|---|---|---|---|
| 5,990,506 A | * | 11/1999 | Fossum | G11C 19/282 250/206 |
| 6,064,069 A | * | 5/2000 | Nakano | H01L 27/14625 250/370.08 |
| 6,388,278 B1 | * | 5/2002 | Suzuki | H01L 27/14818 257/222 |
| 7,736,937 B2 | | 6/2010 | Nomura et al. | |

FOREIGN PATENT DOCUMENTS

| | | |
|---|---|---|
| JP | 2007-53250 A | 3/2007 |
| JP | 2008-187028 A | 8/2008 |
| JP | 2016-201400 A | 12/2016 |

* cited by examiner

*Primary Examiner* — Richard A Booth
(74) *Attorney, Agent, or Firm* — White & Case LLP

(57) ABSTRACT

A solid-state imaging device includes a first semiconductor layer of a first conductivity type; a second semiconductor layer of a second conductivity type on the first semiconductor layer; and first and second detectors positioned inside the second semiconductor layer. The first and second detectors are arranged in a first direction along a boundary between the first semiconductor layer and the second semiconductor layer. The device further includes first and second semiconductor regions provided between the first semiconductor layer and the first and second detectors, respectively. The first and second semiconductor regions include second conductivity type impurities with a higher concentration than that in the second semiconductor layer. The first detector has a first thickness along a second direction from the first semiconductor layer toward the second semiconductor layer, and the second detector has a second thickness along the second direction, the second thickness being thicker than the first thickness.

13 Claims, 4 Drawing Sheets

SOLID-STATE IMAGING DEVICE

CROSS-REFERENCE TO RELATED APPLICATIONS

This application is based upon and claims the benefit of priority from Japanese Patent Application No. 2019-048072, filed on Mar. 15, 2019; the entire contents of which are incorporated herein by reference.

FIELD

Embodiments relate to a solid-state imaging device.

BACKGROUND

A solid-state imaging device comprises multiple pixels that are arranged in a semiconductor such as silicon or the like; and each pixel is configured to detect, for example, one of red, green, and blue lights. However, the semiconductor has different optical absorption coefficients for the lights of different wavelengths, respectively. Accordingly, the pixels have different sensitivities for the incident lights of different light colors.

DETAILED DESCRIPTION

Figure 1A:
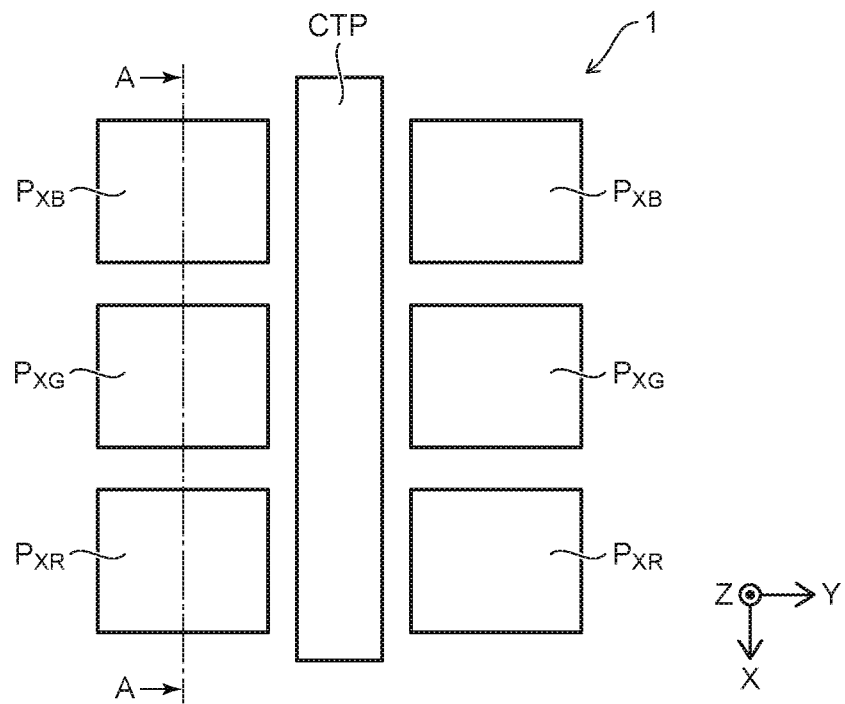
FIGS. 1A and 1B are schematic views showing a solid-state imaging device according to an embodiment.

According to one embodiment, a solid-state imaging device includes a first semiconductor layer of a first conductivity type; a second semiconductor layer of a second conductivity type, the second semiconductor layer being provided on the first semiconductor layer; a first detector positioned inside the second semiconductor layer, the first detector including a first semiconductor portion of the first conductivity type; and a second detector positioned inside the second semiconductor layer, the second detector including a second semiconductor portion of the first conductivity type. The first and second detectors are arranged in a first direction along a boundary between the first semiconductor layer and the second semiconductor layer. The device further includes first and second semiconductor regions. The first semiconductor region is provided between the first semiconductor layer and the first detector. The first semiconductor region includes second conductivity type impurities with a higher concentration than the concentration of second conductivity type impurities in the second semiconductor layer and the concentration of first conductivity type impurities in the first semiconductor portion of the first detector. The second semiconductor region is provided between the first semiconductor layer and the second detector. The second semiconductor region includes the second conductivity type impurity with a higher concentration than the concentration of second conductivity type impurities in the second semiconductor layer and the concentration of first conductivity type impurities in the second semiconductor portion of the second detector. The first detector has a first thickness along a second direction from the first semiconductor layer toward the second semiconductor layer, and the second detector has a second thickness along the second direction, the second thickness being thicker than the first thickness.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
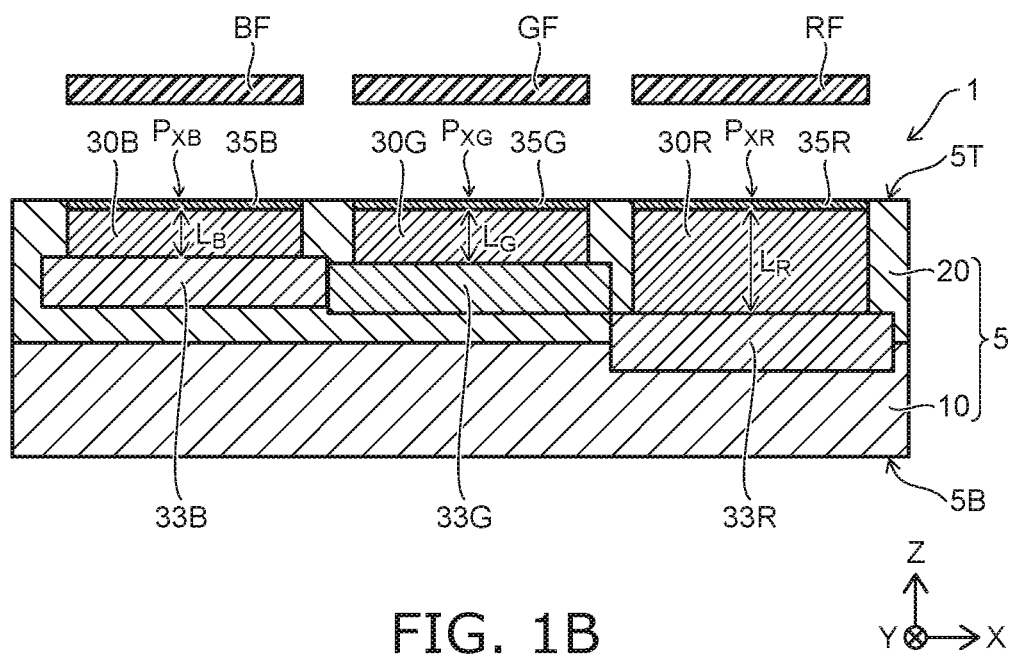

FIGS. 1A and 1B are schematic views showing a solid-state imaging device 1 according to an embodiment. FIG. 1A is a plan view illustrating an arrangement of pixels $P_{XB}$, $P_{XG}$, and $P_{XR}$ of the solid-state imaging device 1. FIG. 1B is a cross-sectional view along line A-A shown in FIG. 1A. The solid-state imaging device 1 is, for example, a CCD (Charge Coupled Device).

As shown in FIG. 1A, the solid-state imaging device 1 includes, for example, a charge transfer portion CTP and three types of pixels arranged in the X-direction. For example, the charge transfer portion CTP is disposed between pixel columns arranged in the Y-direction. The charge transfer portion CTP is electrically connected to each pixel by control electrodes (not-illustrated).

As shown in FIG. 1B, the solid-state imaging device 1 includes, for example, a semiconductor body 5, and color filters BF, GF, and RF placed above the semiconductor body 5. The semiconductor body 5 is, for example, silicon and has a first surface 5T and a second surface 5B. The first surface 5T is the front surface of the semiconductor body 5; and the second surface 5B is the back surface of the semiconductor body 5. The color filters BF, GF, and RF are placed on the first surface 5T side of the semiconductor body 5. The color filter BF selectively transmits, for example, blue light; and the color filter GF selectively transmits, for example, green light. The color filter RF selectively transmits, for example, red light.

The pixels $P_{XB}$, $P_{XG}$, and $P_{XR}$ are provided on the first surface 5T side of the semiconductor body 5. The blue light that passes through the color filter BF is incident on the pixel $P_{XB}$. The green light that passes through the color filter GF is incident on the pixel $P_{XG}$. The red light that passes through the color filter RF is incident on the pixel $P_{XR}$.

The semiconductor body 5 includes, for example, an n-type semiconductor layer 10 and a p-type semiconductor layer 20. The p-type semiconductor layer 20 is provided on the n-type semiconductor layer 10. The p-type semiconductor layer 20 is positioned between the n-type semiconductor layer 10 and each color filter. The n-type semiconductor layer 10 is, for example, an n-type silicon substrate or an n-type silicon layer provided on a silicon substrate. The p-type semiconductor layer 20 is, for example, a p-type well that is selectively provided on the front surface side of the n-type silicon substrate.

The pixel $P_{XB}$ includes a detector 30B, a p-type semiconductor region 33B, and a shield portion 35B. The detector 30B is provided inside the p-type semiconductor layer 20, and includes, for example, an n-type semiconductor. The p-type semiconductor region 33B is positioned between the detector 30B and the n-type semiconductor layer 10. The p-type semiconductor region 33B contacts the detector 30B. The p-type semiconductor region 33B includes p-type impurities with a higher concentration than the concentration of n-type impurities in the n-type semiconductor in the detector 30B.

The p-type semiconductor region 33B includes p-type impurities with a higher concentration than the concentration of p-type impurities in the p-type semiconductor layer 20. For example, in the p-type semiconductor region 33B, the p-type impurity distribution has the maximum concentration of the p-type impurities higher than the concentration of p-type impurities in the p-type semiconductor layer 20. The shield portion 35B is a semiconductor layer including p-type impurities with a higher concentration than the concentration of p-type impurities in the p-type semiconductor layer 20.

The pixel $P_{XG}$ includes a detector 30G, a p-type semiconductor region 33G, and a shield portion 35G. The detector 30G is provided inside the p-type semiconductor layer 20, and includes, for example, an n-type semiconductor. The p-type semiconductor region 33G is positioned between the detector 30G and the n-type semiconductor layer 10. The p-type semiconductor region 33G contacts the detector 30G. The p-type semiconductor region 33G includes p-type impurities with a higher concentration than the concentration of n-type impurities in the n-type semiconductor of the detector 30G.

The p-type semiconductor region 33G includes p-type impurities with a higher concentration than the concentration of p-type impurities in the p-type semiconductor layer 20. For example, in the p-type semiconductor region 33G, the p-type impurity distribution has the maximum concentration higher than the concentration of the p-type impurities in the p-type semiconductor layer 20. The shield portion 35G is a semiconductor layer including p-type impurities with a higher concentration than the concentration of p-type impurities in the p-type semiconductor layer 20.

The pixel $P_{XR}$ includes a detector 30R, a p-type semiconductor region 33R, and a shield portion 35R. The detector 30R is provided inside the p-type semiconductor layer 20, and includes, for example, an n-type semiconductor. The p-type semiconductor region 33R is positioned between the detector 30R and the n-type semiconductor layer 10. The p-type semiconductor region 33R contacts the detector 30R. The p-type semiconductor region 33R includes p-type impurities with a higher concentration than the concentration of n-type impurities in the n-type semiconductor in the detector 30R.

The p-type semiconductor region 33R includes the p-type impurities with a higher concentration than the concentration of p-type impurities in the p-type semiconductor layer 20. For example, in the p-type semiconductor region 33R, the p-type impurity distribution has the maximum concentration of the p-type impurity higher than the concentration of p-type impurities in the p-type semiconductor layer 20. The shield portion 35R is a semiconductor layer including p-type impurities with a higher concentration than the concentration of p-type impurities in the p-type semiconductor layer 20.

The detector 30B has a thickness LB in the Z-direction; and the detector 30G has a thickness LG in the Z-direction. The detector 30R has a thickness LR in the Z-direction. The thickness LB is, for example, a length in the Z-direction capable of reaching the p-type semiconductor region 33B from the shield portion 35B. The thickness LG is, for example, a length in the Z-direction capable of reaching the p-type semiconductor region 33G from the shield portion 35G. The thickness LR is, for example, a length in the Z-direction capable of reaching the p-type semiconductor region 33R from the shield portion 35R.

In the solid-state imaging device 1, for example, the thickness LB is thinner than the thickness LG; and the thickness LG is thinner than the thickness LR. The thickness LB may be substantially the same as the thickness LG; and the thickness LB and the thickness LG are thinner than the thickness LR.

For example, the p-type semiconductor regions 33B, 33G, and 33R are formed by ion-implanting the p-type impurities into the semiconductor body 5 on the first surface 5T side. The p-type impurities in the p-type semiconductor region 33R is implanted with an acceleration energy higher than the acceleration energy with which the p-type impurities are implanted into the p-type semiconductor region 33B and the p-type semiconductor region 33G.

For example, the p-type impurity is ion-implanted into the p-type semiconductor region 33R with the acceleration energy of several MeV. For example, the p-type impurity distribution in the p-type semiconductor region 33R has a concentration peak positioned at a depth in the range of 4 to 5 micrometers (μm) from the first surface 5T of the semiconductor body 5. For example, in the p-type semiconductor regions 33B and 33G, the peak positions of the p-type impurity distributions are located at depths in the range of 1 to 3 μm from the first surface 5T of the semiconductor body 5.

Figure 2A:
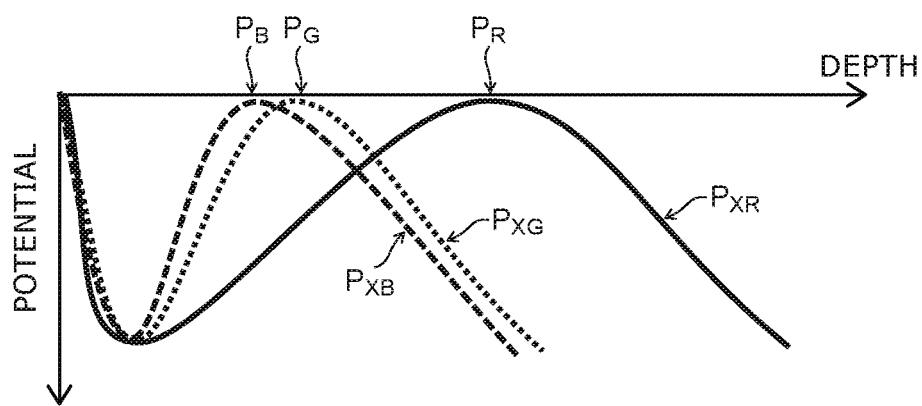
FIGS. 2A and 2B are schematic views showing characteristics of the solid-state imaging device according to the embodiment.
Figure 2B:
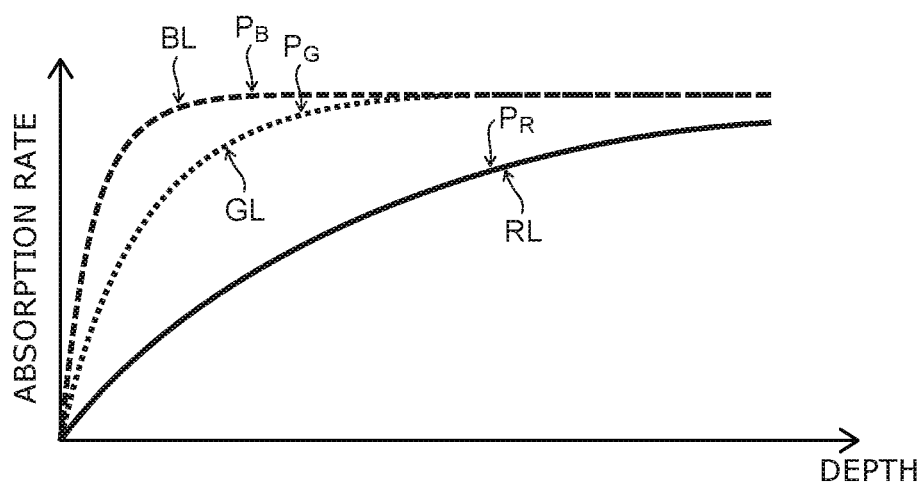

FIGS. 2A and 2B are schematic views showing characteristics of the solid-state imaging device 1 according to the embodiment. FIG. 2A is a schematic view showing the potential distribution of each pixel. FIG. 2B is a schematic view showing the light absorption rate of silicon.

For example, the potential for electrons is illustrated in FIG. 2A. The potential distribution shown in FIG. 2A has peak values in the p-type semiconductor region 33 and the shield portion 35 on the front surface side. Hereinbelow, the shield portions 35B, 35G, and 35R may be described individually or may be described comprehensively as the shield portion 35 for convenience. Also, the p-type semiconductor region 33 and the other components are described in the same manner. $P_B$, $P_G$, and $P_R$ shown in FIG. 2A denote the peak positions of the p-type impurity distributions in the p-type semiconductor regions 33.

For each pixel, the electrons that are excited by the incident light in the detector 30 are stored at the valley of the potential distribution positioned between the p-type semiconductor region 33 and the shield portion 35 (i.e., in the detector 30). Then, the electrons are transported to the charge transfer portion CTP. The electrons, which are excited between the detector 30 and the peak position of the p-type impurity distribution in each p-type semiconductor region 33, also move to the detector 30, and then, are transported to the charge transfer portion CTP. On the other hand, the electrons, which are excited at a position deeper than the peak position of the p-type impurity distribution in each p-type semiconductor region 33 (on the second surface 5B side of the semiconductor body 5), are ejected to the n-type semiconductor layer 10 and do not contribute to the photosensitivity in each pixel.

FIG. 2B shows the change of the optical absorption rate in silicon with respect to the depth from the front surface. The optical absorption rate is obtained by integrating the optical absorption coefficient along the depth direction from the front surface. The optical absorption coefficient of silicon changes depending on the light wavelength. Therefore, the optical absorption rate also changes depending on the light wavelength. As shown in FIG. 2B, the optical absorption rate of the blue light BL is higher than the optical absorption rate of the green light GL; and the optical absorption rate of the green light GL is higher than the optical absorption rate of the red light RL.

For example, at the peak position $P_B$ of the p-type impurity distribution in the p-type semiconductor region 33B shown in FIG. 2A, the optical absorption rate of the blue light BL is 100%; and substantially 100% of the blue light incident on the pixel $P_{XB}$ is absorbed at the detector 30B side. At the peak position $P_G$ of the p-type impurity distribution in the p-type semiconductor region 33G, the optical absorption rate of the blue light BL is about 90%; and about 90% of the green light incident on the pixel $P_{XG}$ is absorbed on the detector 30G side.

For example, when the peak position $P_R$ of the p-type impurity distribution in the p-type semiconductor region 33R is located at the same depth as the peak position $P_B$ or $P_G$, the optical absorption rate of the red light RL on the detector 30R side of the peak position $P_R$ is about 50% in the pixel $P_{XR}$.

In contrast, when the peak position $P_R$ of the p-type impurity distribution in the p-type semiconductor region 33R is set to be deeper than the peak position $P_B$ or $P_G$, for example, the optical absorption rate of the red light RL on the detector 30R side of the peak position $P_R$ can be 70% or more in the pixel $P_{XR}$. Thus, it is possible to suppress the difference in the photosensitivity between the pixels.

The peak positions $P_B$ and $P_G$ of the p-type impurity distribution in the p-type semiconductor regions 33B and 33G may be set to the same depth as the peak position $P_R$ of the p-type impurity distribution in the p-type semiconductor region 33R shown in FIG. 2A. However, when the peak positions $P_B$ and $P_G$ are deeper, the region not contributing to the optical absorption is widened on the front surface side of the peak positions $P_B$ and $P_G$. Therefore, the proportion of the electrons increases, which are excited while being dark (i.e., while the light is not incident into the pixels $P_{XB}$, $P_{XG}$ and $P_{XR}$), and stored in the detectors 30B and 30G. Thus, the dark current of the pixels $P_{XB}$ and $P_{XG}$ increases; and the S/N ratio is degraded.

In the embodiment, by providing the potential distribution depending on the wavelength (or the color) of the light incident on each pixel, it is possible to suppress the difference in the photosensitivity between the pixels; and the photosensitivity can be increased as an entirety.

Figure 3A:
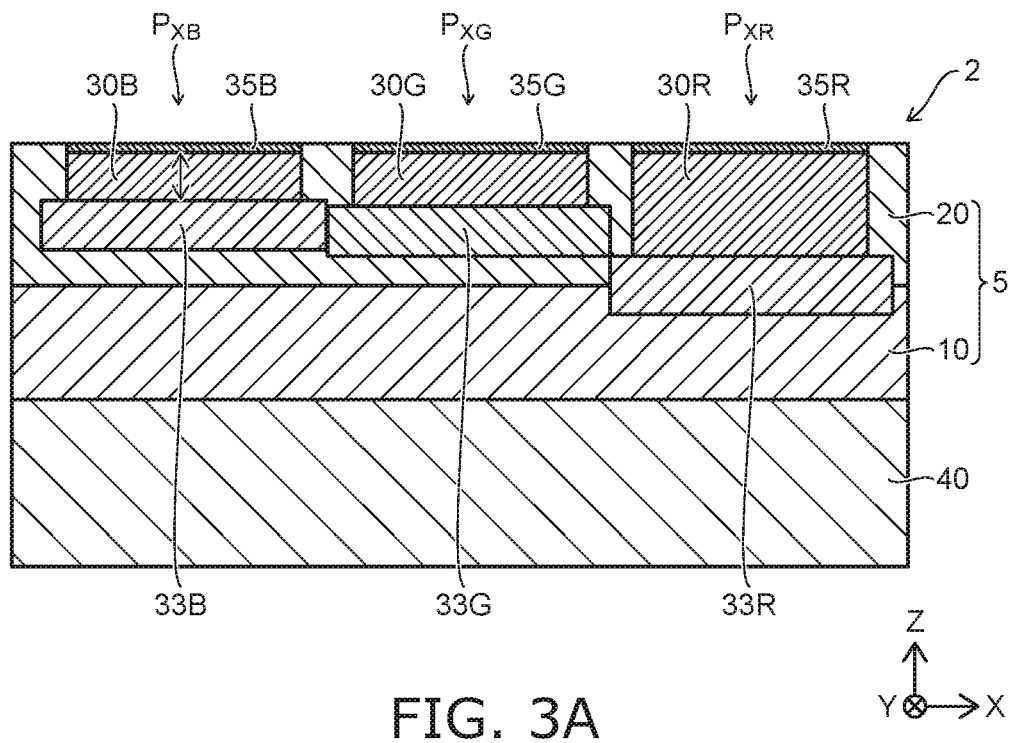
FIGS. 3A and 3B are schematic views showing solid-state imaging devices according to modifications of the embodiment.
Figure 3B:
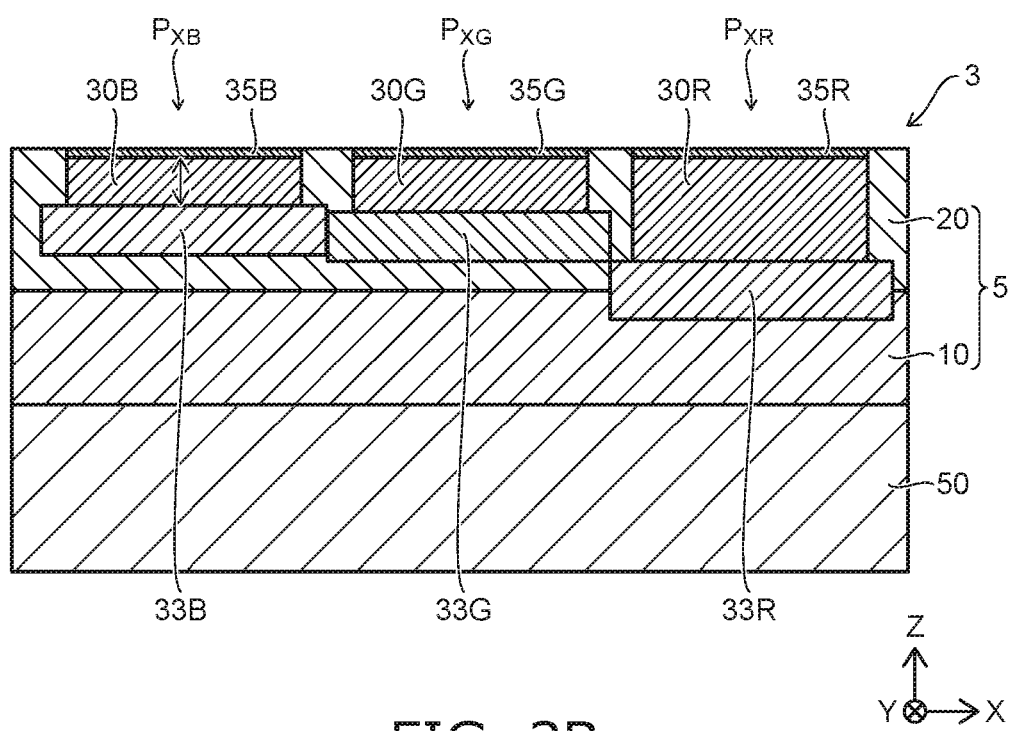

FIGS. 3A and 3B are schematic views showing solid-state imaging devices 2 and 3 according to modifications of the embodiment. The pixels $P_{XB}$, $P_{XG}$, and $P_{XR}$ shown in FIGS. 3A and 3B have the same structure as the example shown in FIG. 1B.

In the solid-state imaging device 2 shown in FIG. 3A, the semiconductor body 5 is provided on an n-type semiconductor substrate 40. The n-type semiconductor substrate 40 is, for example, an n-type silicon substrate. The n-type semiconductor layer 10 is, for example, an n-type well provided on the front surface side of the n-type semiconductor substrate 40. The n-type semiconductor layer 10 may be an n-type semiconductor layer grown on the n-type semiconductor substrate 40.

In the solid-state imaging device 3 shown in FIG. 3B, the semiconductor body 5 is provided on a p-type semiconductor substrate 50. The p-type semiconductor substrate 50 is, for example, a p-type silicon substrate. The n-type semiconductor layer 10 is, for example, an n-type well provided on the front surface side of the p-type semiconductor substrate 50. The n-type semiconductor layer 10 may be grown on the p-type semiconductor substrate 50.

Figure 4A:
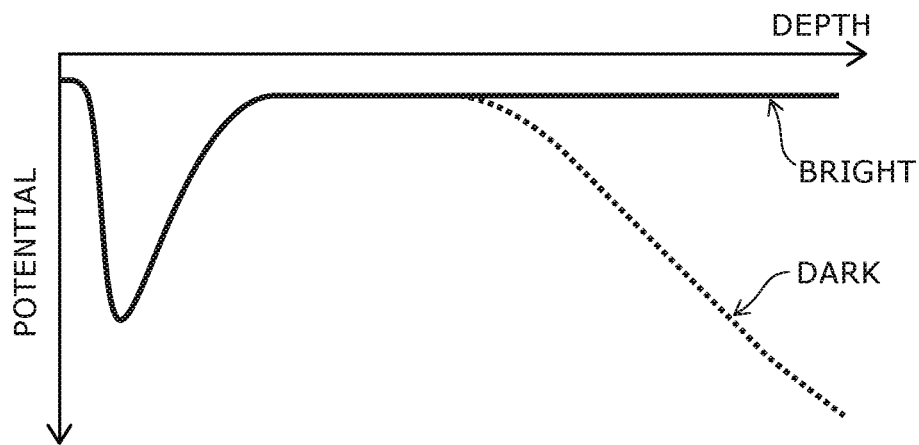
FIGS. 4A and 4B are schematic views showing a method of controlling the solid-state imaging devices according to the embodiment.
Figure 4B:
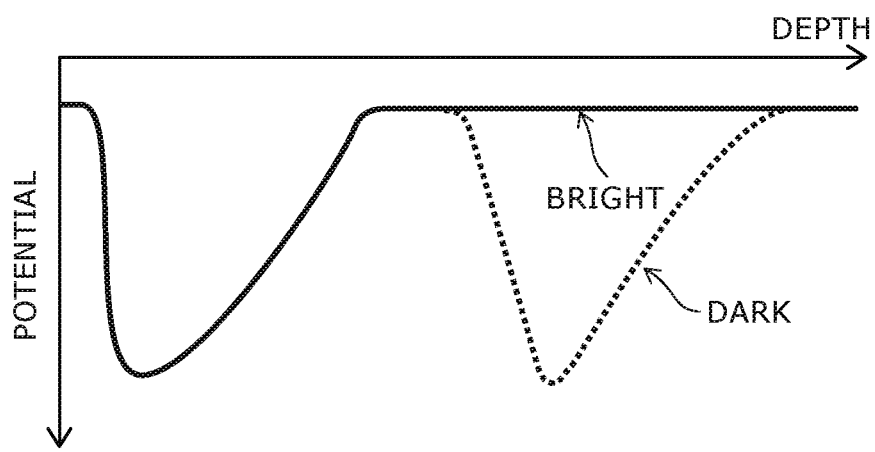

FIGS. 4A and 4B are schematic views showing a method of controlling the solid-state imaging devices 1 to 3 according to the embodiment. FIG. 4A illustrates potential distributions showing the method of controlling the solid-state imaging devices 1 and 2. FIG. 4B illustrates a potential distribution showing the method of controlling the solid-state imaging device 3.

As shown in FIG. 4A, while being dark, a positive potential is applied to the n-type semiconductor layer 10 or the n-type semiconductor substrate 40; and thus, the potential on the second surface 5B side of the semiconductor body 5 is made deeper. That is, the electric potential is applied to the n-type semiconductor substrate 40, which is higher than the electric potential in the detector 30. Thereby, the ejection of the electrons is enhanced, which are generated in the region deeper than the detector 30 (i.e., on the second surface 5B side; referring to FIG. 1B). As a result, the proportion of the electrons can be reduced, which are generated while being dark and stored in the detector 30; and the S/N ratio can be improved.

While being bright, i.e., when light is incident on each pixel, the potential of the n-type semiconductor layer 10 or the n-type semiconductor substrate 40 is lowered; and the potential in the semiconductor body 5 is set to be shallow on the second surface 5B side. Thereby, it is possible to increase the number of electrons that are excited in the p-type semiconductor region 33 and move to the detector 30. Thus, the photosensitivity can be increased in each pixel.

As shown in FIG. 4B, while being dark, a positive potential is applied to the p-type semiconductor substrate 50; and the potential of the semiconductor body 5 is set to be deeper on the second surface 5B side. Thereby, the ejection of the electrons is enhanced, which are generated in the region deeper than the detector 30 (i.e., on the second surface 5B side; referring to FIG. 1B). As a result, it is possible to reduce the proportion of the electrons which are generated while being dark and stored in the detector 30; and the S/N ratio can be improved.

While being bright, i.e., when light is incident on each pixel, the potential in the p-type semiconductor substrate 50 is lowered; and the potential in the semiconductor body 5 is set to be shallow on the second surface 5B side. Thereby, it is possible to increase the number of electrons which is excited in the p-type semiconductor region 33 and move to the detector 30. Thus, the photosensitivity can be increased in each pixel.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A solid-state imaging device, comprising:
   a first semiconductor layer of a first conductivity type;
   a second semiconductor layer of a second conductivity type, the second semiconductor layer being provided on the first semiconductor layer;
   a first detector positioned inside the second semiconductor layer, the first detector including a first semiconductor portion of the first conductivity type;
   a second detector positioned inside the second semiconductor layer, the second detector including a second semiconductor portion of the first conductivity type, the first and second detectors being arranged in a first direction along a boundary between the first semiconductor layer and the second semiconductor layer;
   a first semiconductor region provided between the first semiconductor layer and the first detector, the first semiconductor region including second conductivity type impurities with a higher concentration than the concentration of second conductivity type impurities in the second semiconductor layer and the concentration of first conductivity type impurities in the first semiconductor portion of the first detector; and
   a second semiconductor region provided between the first semiconductor layer and the second detector, the second semiconductor region including the second conductivity type impurity with a higher concentration than the concentration of second conductivity type impurities in the second semiconductor layer and the concentration of first conductivity type impurities in the second semiconductor portion of the second detector,
   the first detector having a first thickness along a second direction from the first semiconductor layer toward the second semiconductor layer,
   the second detector having a second thickness along the second direction, the second thickness being thicker than the first thickness.

2. The device according to claim 1, further comprising:
   a third detector positioned inside the second semiconductor layer, the third detector including a third semiconductor portion of the first conductivity type, the first to third detectors being arranged along the boundary between the first semiconductor layer and the second semiconductor layer; and
   a third semiconductor region provided between the first semiconductor layer and the third detector, the third semiconductor region including second conductivity type impurity with a higher concentration than the concentration of second conductivity type impurities in the second semiconductor layer and the concentration of first conductivity type impurities in the third semiconductor portion of the third detector,
   the third detector having a third thickness along the second direction, the third thickness being thinner than the second thickness of the second detector.

3. The device according to claim 2, wherein
   the second semiconductor layer includes a first portion and a second portion, the first portion being positioned between the first semiconductor layer and the first semiconductor region, the second portion being positioned between the first semiconductor layer and the third semiconductor region, and
   the second semiconductor region contacts the first semiconductor layer.

4. The device according to claim 2, further comprising:
   a third semiconductor layer of the second conductivity type;
   a fourth semiconductor layer of the second conductivity type; and
   a fifth semiconductor layer of the second conductivity type,
   the first detector being positioned between the first semiconductor region and the third semiconductor layer,
   the second detector being positioned between the second semiconductor region and the fourth semiconductor layer,
   the third detector being positioned between the third semiconductor region and the fifth semiconductor layer.

5. The device according to claim 2, further comprising:
   a first filter selectively transmitting blue light;
   a second filter selectively transmitting red light; and
   a third filter selectively transmitting green light,
   the first detector being positioned between the first filter and the first semiconductor region,
   the second detector being positioned between the second filter and the second semiconductor region,
   the third detector being positioned between the third filter and the third semiconductor region.

6. The device according to claim 5, wherein the third thickness of the third detector being thicker than the first thickness of the first detector.

7. The device according to claim 5, wherein the third thickness of the third detector being equal to the first thickness of the first detector.

8. The device according to claim 2, further comprising:
   a charge transfer portion electrically connected to the first to third detectors.

9. The device according to claim 8, wherein
   the first to third detectors being provided respectively in a plurality, the plurality of first detectors including a pair of first detectors arranged along the first semiconductor layer in a first direction, the plurality of second detectors including a pair of second detectors arranged in the first direction, the plurality of third detectors including a pair of third detectors arranged in the first direction; the pair of first detectors, the pair of second detectors and the pair of third detectors being arranged in a second direction crossing the first direction; and
   the charge transfer portion is positioned between the pair of first detectors, between the pair of second detectors and between the pair of third detectors, the charge transfer portion being electrically connected to the pair of first detectors, the pair of second detectors and the pair of third detectors.

10. The device according to claim 1, further comprising a first semiconductor substrate of the first conductivity type,
    the first semiconductor layer being positioned between the second semiconductor layer and the first semiconductor substrate.

11. The device according to claim 10, wherein the device is configured to supply a higher electric potential to the first semiconductor substrate than the electric potentials of the first and second detectors while being dark.

12. The device according to claim 1, further comprising a second semiconductor substrate of the second conductivity type,
    the first semiconductor layer being positioned between the second semiconductor layer and the second semiconductor substrate.

13. The device according to claim 12, wherein the device is configured to supply a higher electric potential to the second semiconductor substrate than the electric potentials of the first and second detectors while being dark.

* * * * *